US012802747B2

(12) United States Patent
Fackenthal et al.

(10) Patent No.: US 12,802,747 B2
(45) Date of Patent: Nov. 17, 2026

(54) LOCAL DIGIT LINE (LDL) COUPLING CANCELLATION

(71) Applicant: Micron Technology, Inc., Boise, ID (US)

(72) Inventors: Richard E. Fackenthal, Carmichael, CA (US); Christopher K. Morzano, Boise, ID (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 324 days.

(21) Appl. No.: 18/499,934

(22) Filed: Nov. 1, 2023

(65) Prior Publication Data

US 2024/0194251 A1 Jun. 13, 2024

Related U.S. Application Data

(60) Provisional application No. 63/386,590, filed on Dec. 8, 2022.

(51) Int. Cl.
*G11C 11/4097* (2006.01)

(52) U.S. Cl.
CPC ................................ *G11C 11/4097* (2013.01)

(58) Field of Classification Search
CPC .......... G11C 11/4097; G11C 7/15; G11C 7/18
USPC ..................................................... 365/189.02
See application file for complete search history.

(56) References Cited

U.S. PATENT DOCUMENTS

| | | | | | |
|---|---|---|---|---|---|
| 6,043,562 | A * | 3/2000 | Keeth | H10B 12/488 257/776 |
| 6,975,552 | B2 * | 12/2005 | Kim | G11C 7/18 365/205 |
| 7,012,826 | B2 * | 3/2006 | Barth, Jr. | G11C 11/4097 365/230.03 |
| 9,406,351 | B2 * | 8/2016 | Stansfield | G11C 11/419 |
| 2011/0134678 | A1 * | 6/2011 | Sato | G11C 7/08 365/63 |

* cited by examiner

*Primary Examiner* — Connie C Yoha
(74) *Attorney, Agent, or Firm* — Fletcher Yoder, P.C.

(57) ABSTRACT

Devices and methods for operating a memory device including multiple memory cells configured to store data and multiple global digit lines configured to carry the data in memory accesses of the memory cells. The memory device also includes multiple local digit lines configured to carry the data between the global digit lines and the memory cells. The memory device further includes multiple digit line selection circuits configured to selectively couple selected local digit lines of the local digit lines to the global digit lines. The memory device also includes a controller configured to select a pattern of selected digit line selection circuits to at least partially cancel capacitive coupling between the selected local digit lines.

18 Claims, 5 Drawing Sheets

LOCAL DIGIT LINE (LDL) COUPLING CANCELLATION

CROSS-REFERENCE TO RELATED APPLICATIONS

This application claims priority to U.S. Application No. 63/386,590, filed Dec. 8, 2022, entitled "LOCAL DIGIT LINE (LDL) COUPLING CANCELLATION," the disclosure of which is incorporated by reference herein in its entirety for all purposes.

BACKGROUND

Field of the Present Disclosure

Embodiments of the present disclosure relate generally to memory devices. More specifically, embodiments of the present disclosure relate to cancelling coupling between local digit lines of the memory devices.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor. Memory devices may use global digit lines and fanned out local digit lines to enable memory accesses. The global digit lines may be selectively coupled to local digit lines corresponding to a target location. However, these global digit lines may capacitively couple to each other and the local digit lines may also capacitively couple together during operation to introduce noise on the data line.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, global digit lines may capacitively couple to each other and the local digit lines may also capacitively couple together during operation to introduce noise on the data line. As discussed below, part of the noise of the global digit lines may be at least partially offset using twisting the global digit lines and using a dummy selected local digit line. However, there may still be a negative impact on performance in the memory device due to the capacitive coupling between the local digit lines. To at least partially offset/cancel/compensate for such coupling, multiple local digit lines may be selected. For example, a dummy local digit line may be selected in each region between twists of the global digit line.

Figure 1:
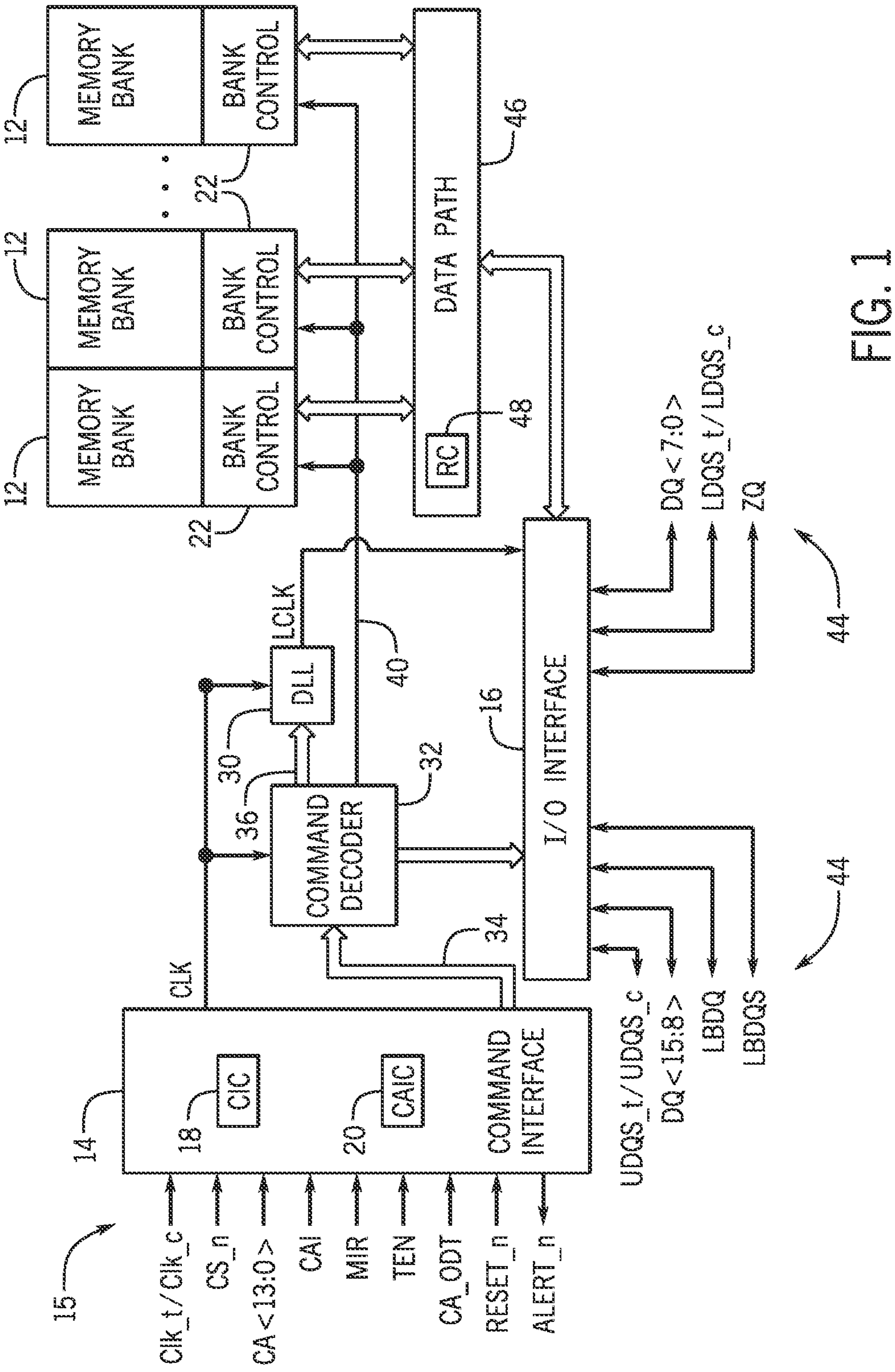
FIG. 1 is a simplified block diagram illustrating certain features of a memory device including routing circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device or double data rate type four synchronous dynamic random access memory (DDR4 SDRAM). In other embodiments, the memory device 10 may be or may include a low-power memory device, such as a low-power double data rate (LPDDR) synchronous dynamic random access memory (SRAM) device of various types. These types may include, among others, a low-power double data rate type four synchronous dynamic random access memory (LPDDR4 SDRAM or LPDDR4X SDRAM), a low-power double data rate type five synchronous dynamic random access memory (LPDDR5 SDRAM), or other types of low-power memory devices.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. Various other configurations, organization and sizes of the memory banks 12 on the memory device 10 may be utilized depending on the application and design of the overall system and the type of memory employed.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary/bar clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands and/or delivery of data to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46. Data I/O signals, generally referred to as DQ signals, are generally transmitted and received in one or more bi-directional data buses. For certain memory devices, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance. In some embodiments, the data path 46 may include routing circuitry (RC) 48 that may include lines for transmitting data to and from memory cells of the memory banks 12. The routing circuitry 48 may be controlled by controller circuitry that is not individually illustrated as it may be implemented using the command interface 14, the IO interface 16, the command decoder 32, the bank control 22, and/or other suitable circuitry.

To allow for higher data rates within the memory device 10, certain memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain SDRAM memory devices, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback data signal (LBDQ) and loopback strobe signal (LBDQS) may be provided to the memory device 10 through the I/O interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a data pin. This is generally intended to be used to monitor the data captured by the memory device 10 at the I/O interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device. Although loopback pins are illustrated in the embodiment (e.g., DDR5) memory device 10 of FIG. 1, in some embodiments (e.g., low-power versions) of the memory device 10, such pins and/or other features may not be available.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
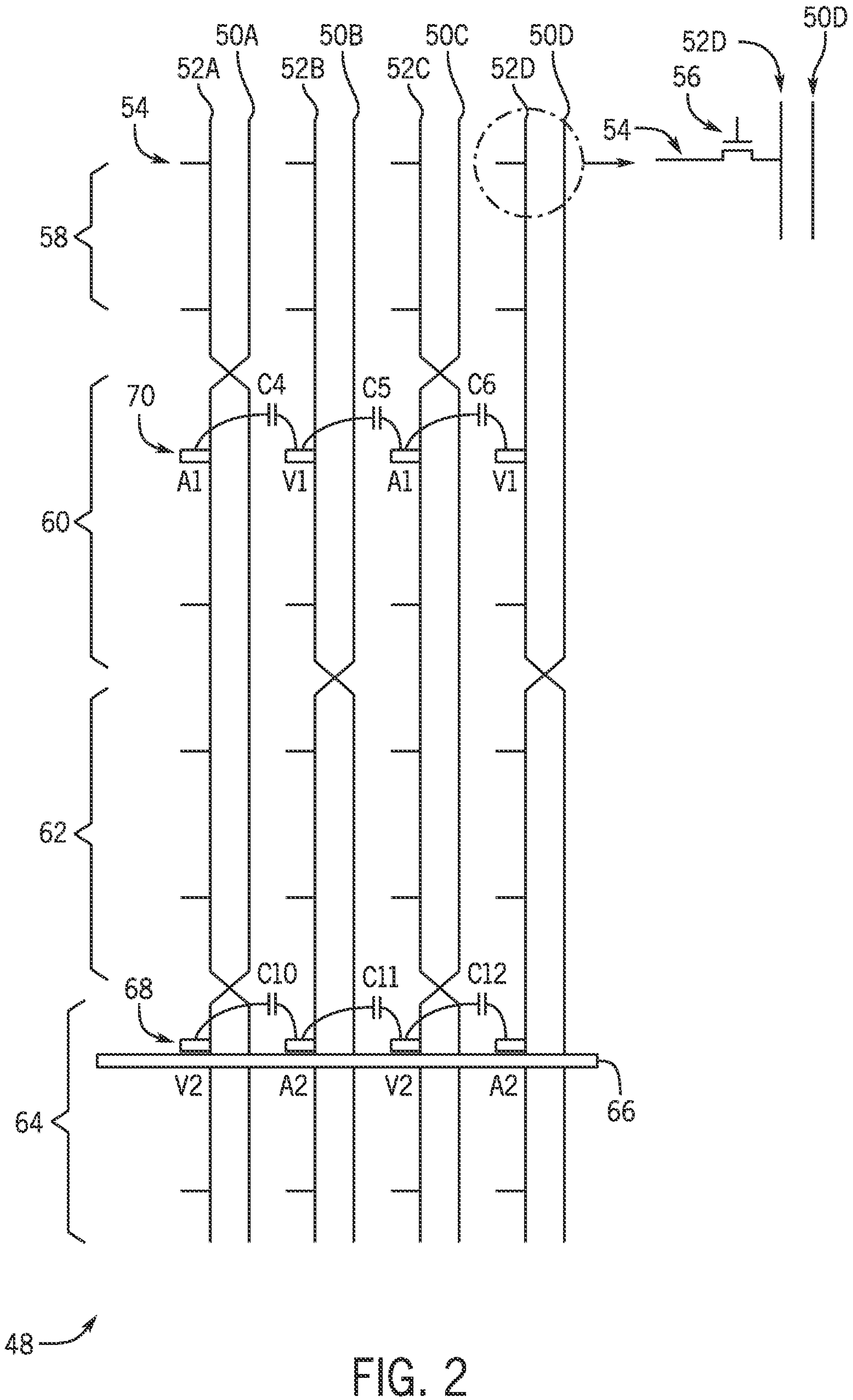
FIG. 2 is a simplified diagram of the routing circuitry of FIG. 1 with a selected local digit line and a single dummy selected digit line, according to an embodiment of the present disclosure.

FIG. 2 illustrates a simplified diagram embodiment of the routing circuitry 48. The routing circuitry 48, as illustrated, includes global digit lines (GDL) 50 (individually referred to as 50A, 50B, 50C, and 50D, respectively). The routing circuitry 48 may also include global digit bar lines (GDL-bar) 52 (individually referred to as 52A, 52B, 52C, and 52D, respectively). Each GDL 50 is paired with a respective GDL-bar 52 that carries data that is complementary with data in the respective GDL 50. For instance, the GDL 50A is a complementary pair with the GDL-bar 52A such that GDL-bar 52A goes low when GDL 50A goes high and so on. Furthermore, the GDLs 50 act as a global bus to provide access to and from memory cells of the memory banks 12 via local digit lines (LDLs) 54. For example, the LDLs 54 may couple to the GDLs 50 and GDL-bars 52 and lead away from the GDLs 50 and GDL-bars 52 down from the GDLs 50 and GDL-bars 52. Each intersection between respective LDLs 54 is gated using selection circuits, such as a digit line multiplexer (DLmux) 56 controlled by the controller circuitry used to control the routing circuitry 48. Although the DLmux 56 is illustrated as an access transistor (e.g., NMOS transistor), the DLmux 56 may be implemented using any circuitry that enables selectively connecting a respective LDL 54 to a respective GDL 50 or GDL-bar 52.

The illustrated routing circuitry 48 have the GDLs 50 and the GDL-bars 52 arranged using a vertical GDL twist scheme where each pair (e.g., respective GDL 50 and GDL-bar 52 pair) are oriented vertically with either the respective GDL 50 or the respective GDL-bar 52 vertically above the other. In the vertical twist scheme, which digit line that is on top changes in different regions or quarters between twists of the GDLs 50 or the GDL-bars 52. For example, the right-most line in the FIG. 2 may actually be the line on top. For instance, the GDLs 50A, 50B, 50C, and 50D are on top in region 58. Likewise, in the region 60, the GDL-bars 52A and 52C along with the GDLs 50B and 50D are on top. Similarly, the GDL-bars 52A, 52B, 52C, and 52D are on top in region 62. Additionally, in region 64, the GDLs 50A and 50C are on top along with the GDL-bars 52B and 52D. Although the illustrated embodiment of the routing circuitry 48 includes four regions 58, 60, 62, and 64, some embodiments of the memory device 10 may include any other numbers of regions, such as 4, 8, 16, or more regions. Furthermore, although the illustrated regions include only two LDLs 54 per GDL 50/GDL-bar 52 per region for simplicity, it may be appreciated that each GDL 50/GDL-bar 52 may include more LDLs 54 (e.g., 5, 10, 15, 20 or more LDLs 54) than illustrated. Furthermore, although a specific pattern of GDLs 50 and GDL-bars 52 being the top digit line in particular regions is illustrated, other suitable patterns of the GDLs 50 and GDL-bars 52 being the top digit line in particular regions may be employed.

The LDLs 54 may be coupled to the GDLs 50 or GDL-bars 52 by selective respective DLmuxs 56. For example, a wordline (WL) 66 may be selected along with the corresponding selected DLmuxes 68. Since the GDLs 50 and the GDL-bars 52 are arranged vertically, the adjacent lines (e.g., bottom lines) may still capacitively couple with each other. For instance, capacitors C10, C11, and C12 may be the capacitive coupling between victim nodes V2 (between GDL-bars 52A and 52C and respective LDLs 54) that are being pulled upward or downward by aggressor nodes A2 (between GDLs 50B and 50D and respective LDLs 54). To counteract some noise on the digit lines, dummy selected LDLs 70 may also be selected by selecting/connecting them to the respective GDL 50 or respective GDL-bar 52 even though they are not being used to access memory cells at the time. The selection of these dummy selected LDLs 70 may also cause capacitive coupling (e.g., C4, C5, and C6) between victim nodes V1 (between GDL-bars 52B and 52D and respective LDLs 54) that are being pulled upward or downward by aggressor nodes A2 (between GDLs 50A and 50C and respective LDLs 54). Since each GDL 50 and GDL-bar 52 in each pair are both pulled in the same direction, the twisted pair scheme is able to cancel noise between the GDLs 50 and GDL-bars 52. This is at least partially due to the same matched total digit line capacitance for the GDLs 50 and GDL-bars 52 due to the selection of the dummy selected LDLs 70. However, the coupling between LDLs 54 may still be problematic. For example, if V1*s* are going low while A1*s* are going high, A1*s* couple V1*s* high hurting the signal. In addition, the selected DLmuxes 68 near the selected WL 66 push a high-going LDL low. Both impact the signal on the victim GDLs 50. As another example, A2*s* couple to V2*s* through pushing a low-going signal high, while its reference, is being pulled low by C5 and C6.

Figure 3:
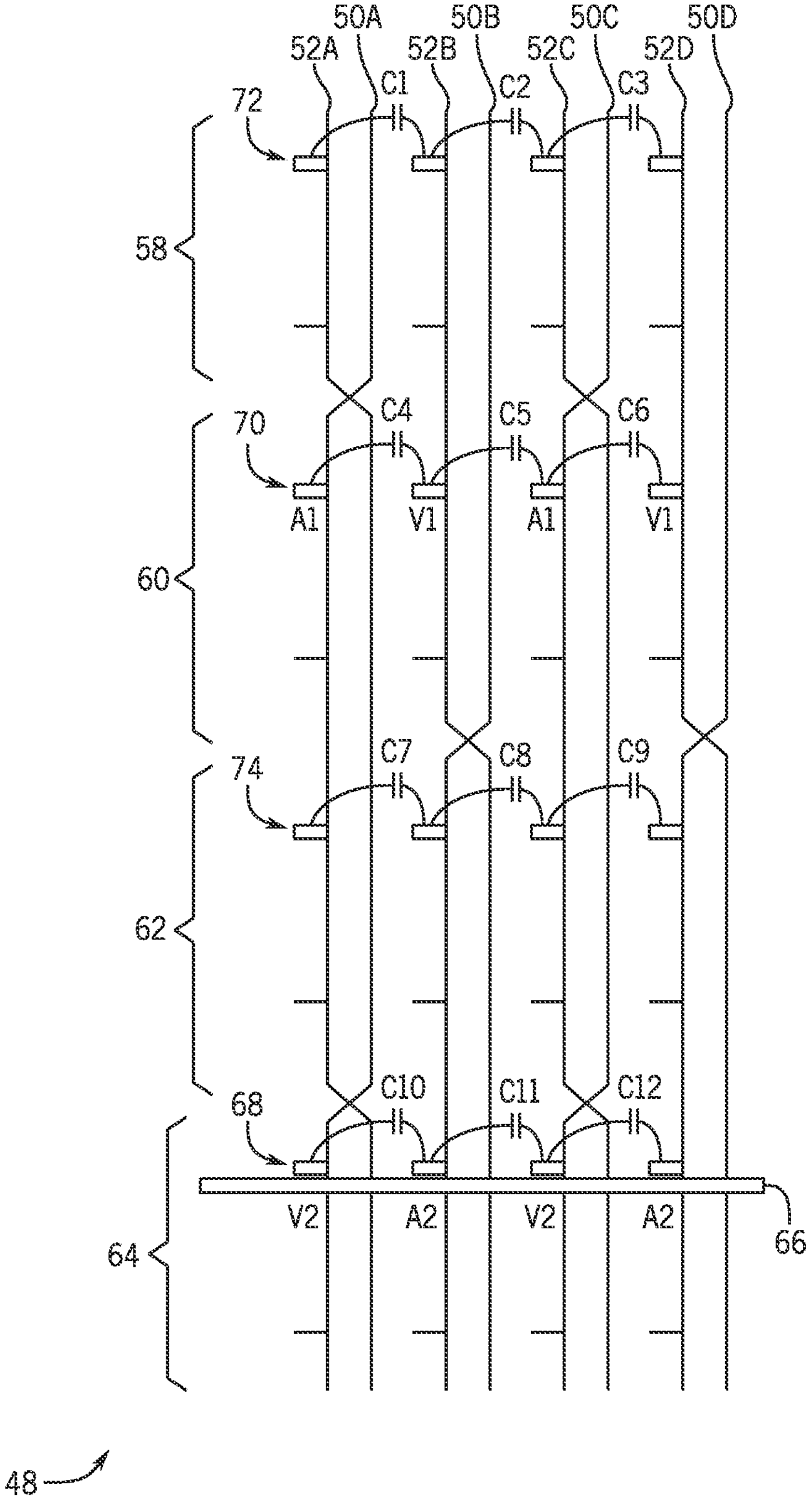
FIG. 3 is a simplified diagram of the routing circuitry of FIG. 1 with a selected local digit line and three dummy selected local digit lines, according to an embodiment of the present disclosure.

Thus, to address the capacitive coupling of the LDLs 54, LDLs 54 may be selected in each region. For instance, FIG. 3 shows a simplified diagram of an embodiment of the routing circuitry 48 that activates LDLs 54 in additional regions (e.g., in each of the 4 regions, in 3 or more regions, etc.). For instance, in addition to the selected DLmuxes 68 and the dummy selected LDLs 70 in respective regions 60 and 64, dummy selected LDLs 72 and 74 are selected in the respective regions 58 and 62. By selecting dummy selected LDLs 72 and 74 in addition to the dummy selected LDLs 70, every pair of aggressors surrounding a victim may be offset by a pair of "helper nodes" that counteract the impacts of the aggressors. For example, V1*s* may tend to couple high by A1*s* via capacitors C4 and C5. This coupling high is at least partially counteracted/canceled by capacitors C1 and C2 that tend to pull the same V1 node low in the opposite direction of the pull up by the A1*s* due to "helper nodes" coupled to V1 via the capacitors C1 and C2. Likewise V2 may tend to couple high due to connection to A2*s* via capacitors C11 and C12. However, that coupling high may be at least partially counteracted/canceled by the capacitors C2 and C3 that tend to pull the same V2 node low in the opposite direction of the pull up by the A2*s* due to "helper nodes" between coupled to V2 via the capacitors C2 and C3.

Figure 4:
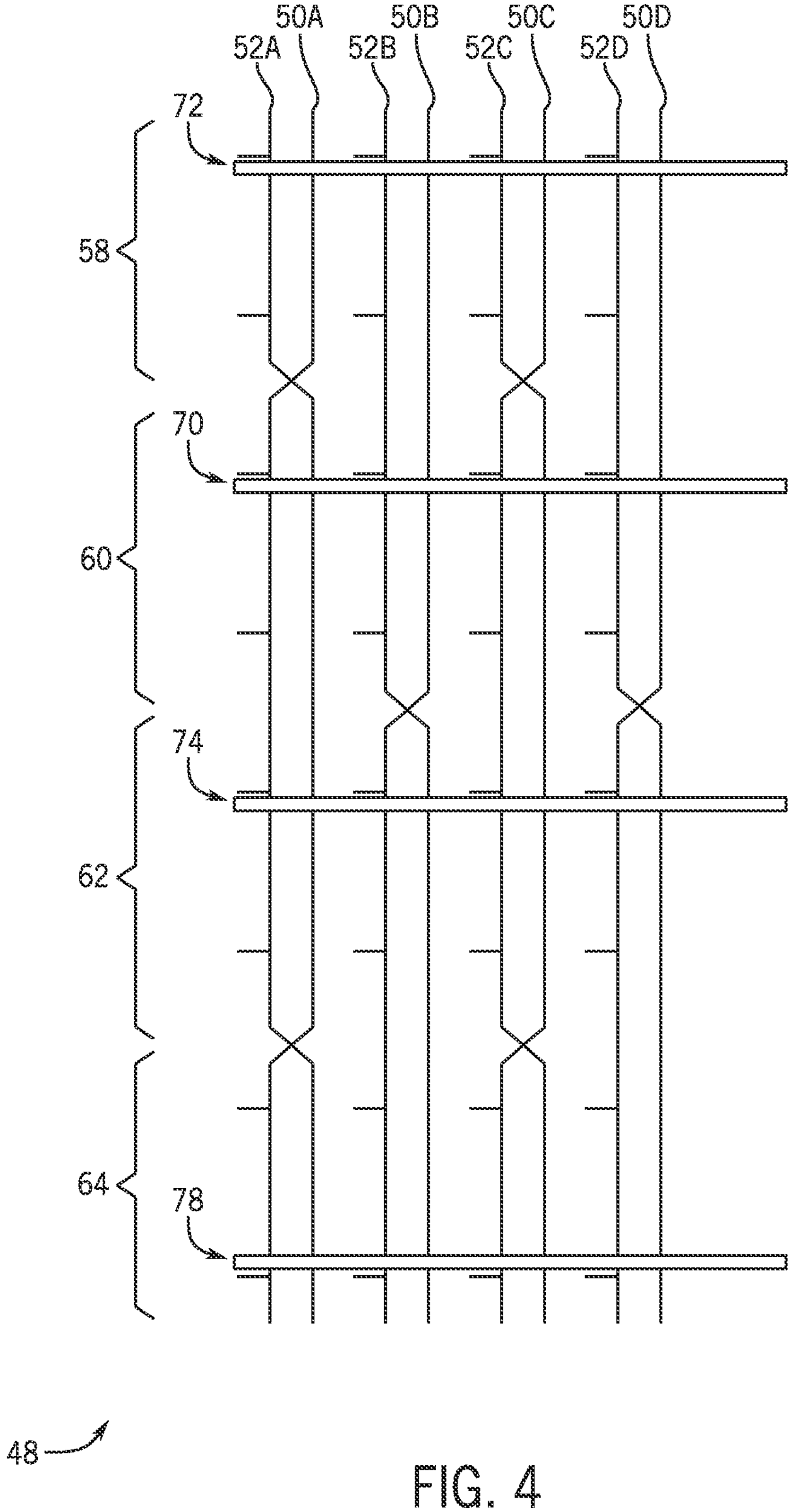
FIG. 4 is a simplified diagram of the routing circuitry of FIG. 1 in an idle mode with four dummy selected local digit lines, according to an embodiment of the present disclosure.

As illustrated, the dummy selected LDLs 70, 72, and 74 may be selected while selected LDLs 78 are being actively used to access memory cells. However, the switching of multiple DLmuxes 56 may consume power. One way to reduce power consumption due to DLmux 56 switching is to leave the dummy selected LDLs 70, 72, and 74 selected during idle modes as illustrated in an embodiment of the routing circuitry 48 shown in FIG. 4. Furthermore, the dummy selected LDLs 78 may also be selected in the region 64. The locations of these "default" dummy selected LDLs 70, 72, 74, and 78 with the respective regions 60, 58, 62, and 64 may be predefined defaults that begin at startup. These predefined dummy selected LDLs may remain constant through operation of the memory device. Additionally or alternatively, after a selected LDL is selected and used in memory access, that selected LDL may be reused as a dummy selected LDL in subsequent idle phases and/or other active phases with accesses in other regions. This reuse of the selected LDL as a dummy LDL may continue until the region where the selected LDL is uses a different active selected LDL to perform a memory access.

Figure 5:
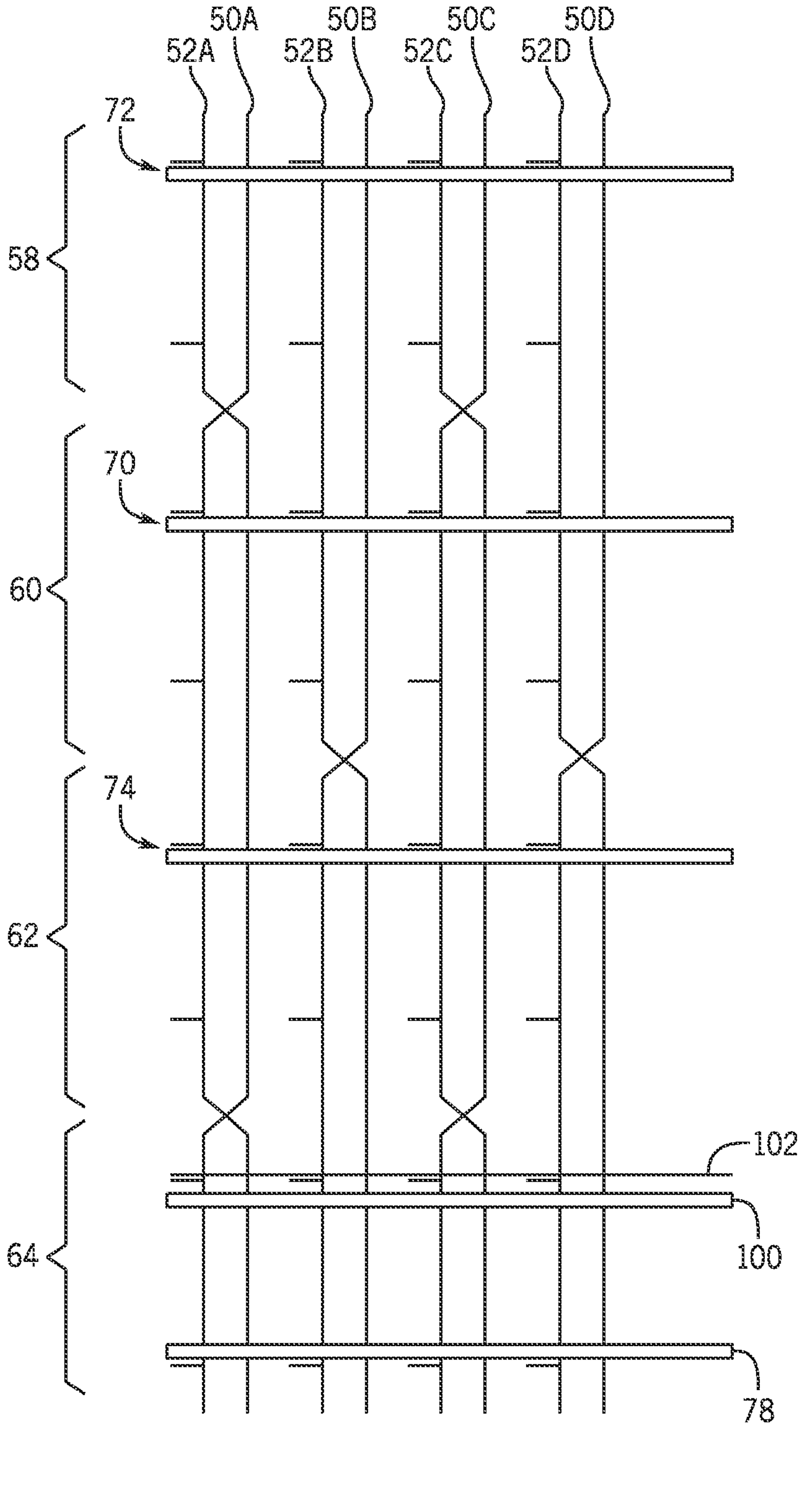
FIG. 5 is a simplified diagram of the routing circuitry of FIG. 1 in an active mode with a selected local digit line and three dummy selected local digit lines after the idle mode of FIG. 4, according to an embodiment of the present disclosure.

When the routing circuitry 48 is to go into an active mode after the idle mode, only the region to be used is switched. For instance, FIG. 5 shows an embodiment of the routing circuitry 48 in an active mode after the idle mode of FIG. 4. The memory access of the active mode is to occur in the region 64. Accordingly, the dummy selected LDLs 70, 72, and 74 remain selected. However, the dummy selected LDL 78 is deselected. After the dummy selected LDL 78 is deselected, a different selected LDL 100 is selected using one or more corresponding DLmuxes 56 for the memory access via the region 64. With the different selected LDL 100 selected, WL 102 may be selected for the memory access. Then, the WL 102 and the different selected LDL 100 are used to perform the memory access. After the memory access has been performed, the routing circuitry 48 may return to idle mode. In the return to the idle mode, the different selected LDL 100 may be retained as a dummy LDL for the idle mode or the dummy selected LDL 78 may be re-selected as a dummy LDL in the idle mode.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device comprising:

a plurality of memory cells configured to store data;

a plurality of global digit lines configured to carry the data in memory accesses of the plurality of memory cells;

a plurality of local digit lines configured to carry the data between the plurality of global digit lines and the plurality of memory cells;

a plurality of digit line selection circuits configured to selectively couple selected local digit lines of the plurality of local digit lines to the plurality of global digit lines, wherein the plurality of digit line selection circuits comprises a plurality of twists of the plurality of global digit lines alternating between a respective global digit line and a corresponding complementary global digit line to alternate positions; and a controller configured to select a pattern of selected digit line selection circuits to at least partially cancel capacitive coupling between the selected local digit lines, wherein the pattern comprises a selected local digit line in each region between each twist of the plurality of twists and the pattern comprises at least one active local digit line used to transfer data via a first region between a first pair of twists of the plurality of twists and a plurality of dummy selected local digit lines of the plurality of local digit lines in other regions between other twists of the plurality of twists.

2. The device of claim 1, wherein the plurality of digit line selection circuits comprises a plurality of multiplexers.

3. The device of claim 1, wherein the plurality of digit line selection circuits comprises a plurality of access transistors.

4. The device of claim 1, wherein each of the plurality of twists alternate between the respective global digit line and the corresponding complementary global digit line being vertically on top in a respective pair.

5. The device of claim 1, wherein the other regions comprise three regions.

6. The device of claim 1, wherein the controller is configured to select a plurality of default dummy selected local digit lines of the plurality of local digit lines during an idle mode when no memory is being accessed via the plurality of local digit lines.

7. The device of claim 6, wherein the controller is configured to transition from and use an active state by:

unselecting one of the plurality of default dummy selected local digit lines;

selecting an active local digit line of the plurality of local digit lines;

selecting a word line; and performing a memory access using the active local digit line, a corresponding global digit line, and the word line.

8. The device of claim 7, wherein the controller is configured to use the active local digit line as a dummy selected local digit line for a subsequent idle mode.

9. The device of claim 7, wherein the controller is configured to use the unselected one of the plurality of default dummy selected local digit lines as a dummy selected local digit line for a subsequent idle mode.

10. A method for operating a memory device, comprising:

selecting a local digit line of a plurality of local digit lines for a memory access to couple to a corresponding global digit line;

selecting a portion of the plurality of local digit lines as dummy local digit lines in a plurality of regions to compensate for capacitive coupling between global digit lines and to compensate for capacitive coupling between local digit lines, wherein each region corresponds to a segment of a global digit line between twists of the global digit line with a corresponding complementary global digit line; and performing the memory access using the local digit line, a corresponding word line, and the corresponding global digit line.

11. The method of claim 10, comprising using an access transistor to select the local digit line.

12. The method of claim 10, comprising cancelling at least a portion of global digit line noise using the twists.

13. The method of claim 12, wherein the plurality of regions comprise four regions.

14. The method of claim 10, comprising:

unselecting one of a plurality of default dummy selected local digit lines used in an idle mode;

selecting an active local digit line of the plurality of local digit lines;

selecting the word line; and performing the memory access using the active local digit line, the corresponding global digit line, and the word line.

15. The method of claim 14, comprising using the active local digit line as a dummy selected local digit line for a subsequent idle mode.

16. The method of claim 14, comprising using the unselected one of the plurality of default dummy selected local digit lines as a dummy selected local digit line for a subsequent idle mode.

17. A device comprising:

a plurality of memory cells configured to store data;

a plurality of global digit lines configured to carry the data in memory accesses of the plurality of memory cells;

a plurality of complementary global digit lines each configured to carry complementary data for a respective global digit line of the plurality of global digit lines, wherein each pair of a respective global digit line and a respective complementary global digit line are twisted with the respective global digit line and the respective complementary global digit line alternate which is vertically on top in the respective pair;

a plurality of local digit lines configured to carry the data between the plurality of global digit lines and the plurality of memory cells;

a plurality of digit line selection circuits configured to selectively couple selected local digit lines of the plurality of local digit lines to the plurality of global digit lines; and a controller configured to;

select the selected local digit lines in each region corresponding to a segment of at least one of the plurality of global digit lines between twists to at least partially cancel capacitive coupling between the selected local digit lines;

unselect one of a plurality of default dummy selected local digit lines used during an idle mode;

select an active local digit line of the plurality of local digit lines;

select a word line; and perform a memory access using the active local digit line, a corresponding global digit line, and the word line.

18. The device of claim 17, wherein the controller is configured to use the unselected one of the plurality of default dummy selected local digit lines as a dummy selected local digit line for a subsequent idle mode.

* * * * *